United States Patent [19]

Trett

[11] Patent Number: 4,976,337
[45] Date of Patent: Dec. 11, 1990

[54] PROXIMITY DETECTION SYSTEMS

[75] Inventor: John Trett, Marlow, United Kingdom

[73] Assignee: Formula Systems Limited, Oxford, England

[21] Appl. No.: 312,707

[22] PCT Filed: Jun. 10, 1988

[86] PCT No.: PCT/GB88/00451
§ 371 Date: Feb. 8, 1989
§ 102(e) Date: Feb. 8, 1989

[87] PCT Pub. No.: WO88/09862
PCT Pub. Date: Dec. 15, 1988

[30] Foreign Application Priority Data

Jun. 11, 1987 [GB] United Kingdom ............... 8713654

[51] Int. Cl.$^5$ ............................................. B66B 13/00
[52] U.S. Cl. .............................. 187/51; 187/DIG. 1; 187/104; 250/221
[58] Field of Search ................. 187/51, 48, DIG. 1, 187/1 R, 103, 104, 132; 250/221

[56] References Cited

U.S. PATENT DOCUMENTS

| | | | |
|---|---|---|---|
| 2,149,177 | 2/1939 | Miller | 187/DIG. 1 |
| 2,900,521 | 8/1959 | Eames | 187/DIG. 1 |
| 3,370,677 | 2/1968 | Federmann et al. | 187/51 |

FOREIGN PATENT DOCUMENTS

| | | | |
|---|---|---|---|
| 671223 | 9/1963 | Canada | 187/51 |
| 3146152A1 | 10/1967 | Fed. Rep. of Germany | |
| PCTUS/820-0113 | 8/1982 | PCT Int'l Appl. | |

OTHER PUBLICATIONS

MOS FET Takes the Push out of Elevator Push Button, Fred G. Geil, Electronics, Oct. 30, 1967, pp. 70, 71.

Primary Examiner—H. Grant Skaggs
Assistant Examiner—Kenneth Noland
Attorney, Agent, or Firm—Christie, Parker & Hale

[57] ABSTRACT

An elevator car, supports a pair of sliding car doors which can be moved in synchronism towards or away from one another to close or open. An elongate detector strip is mounted on the outer face of respective car doors adjacent the leading edges thereof. A pair of opposing landing walls support respective ones of two sliding landing doors. The landing doors are synchronized to open and close with the car doors by control circuitry. The detector strips together define three separate regions in which detection of an obstruction can take place namely, a column like region extending across the leading edges of the car door and the landing door a column like region extending across the leading edges of the car door and the landing door, and a planar region extending vertically between the detector strips.

9 Claims, 2 Drawing Sheets

PROXIMITY DETECTION SYSTEMS

The present invention relates to proximity detection systems and in particular, but not exclusively to door detection systems for elevator or lift doors.

Various devices have been proposed for preventing lift doors from closing or for causing lift doors to reverse, during closing, where an obstruction is sensed in the doorway.

With one type of device an array of beams is caused to traverse the opening between a lift door and its opposing slam post or between two synchronised lift doors aligned in the same plane to move towards, or away from, one another synchronously.

While such a device will detect an obstruction in the left door opening it cannot detect the presence of an obstruction in the opening of the corresponding landing doors, nor can it detect the approach of an obstruction to the opening. Thus for example fingers may be trapped between the landing doors as they close.

With another type of device, a capacitive or infra red detector is mounted along the edge of the or each lift door. Such detectors can detect the presence of obstructions both in the opening defined by the lift doors and in areas on opposite sides of the opening. The range of such devices is limited and so while obstructions are detected in the vicinity of the door edges, an obstruction in the centre of the opening is not detected until the doors have moved in closer to bring the obstruction into the range of the detectors.

Thus while these detectors are more efficient at detecting obstructions in, and close to, the lift door opening, the closing of the doors and the sudden opening of the doors when they approach an obstruction will tend to be unsettling for those users of the lift who may be infirm or of nervous disposition.

It is an object of the invention to provide an improved proximity detection system.

According to the invention there is provided a proximity detection system comprising a detection strip mountable adjacent the leading edge of door, the detection strip having two detection zones, a columnar zone extending parallel to the strip and arranged to be located immediately in front of the leading edge of the door, and a planar zone extending across any opening defined between the leading edge of the door and the opposing edge of the opening.

Preferably said two zones intersect one another.

According to the present invention there is further provided a proximity detection system comprising an optical line of sight detector, positioned adjacent one side of an opening in which detection is to take place, a capacitive detector having a capacitive plate or antenna of translucent electrically conductive material, located adjacent said one side of the opening between the line of sight detected and the said one side of the opening, so that optical transmission to or from the detector takes place through said capacitive plate.

Proximity detector system embodying the present invention will now be described, by way of example, with reference to the accompanying diagrammatic drawings, in which.

Figure 2:
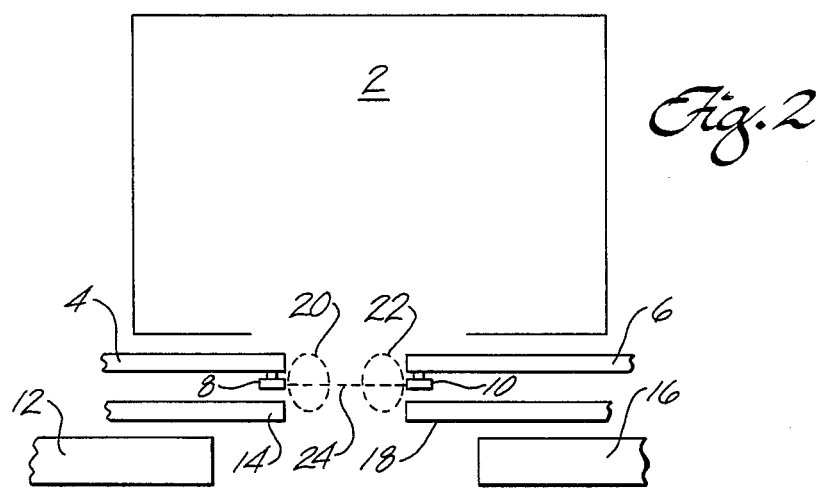
FIG. 2 is a plan view of a lift car with the system of FIG. 1 mounted on opposing lift doors.
Figure 3:
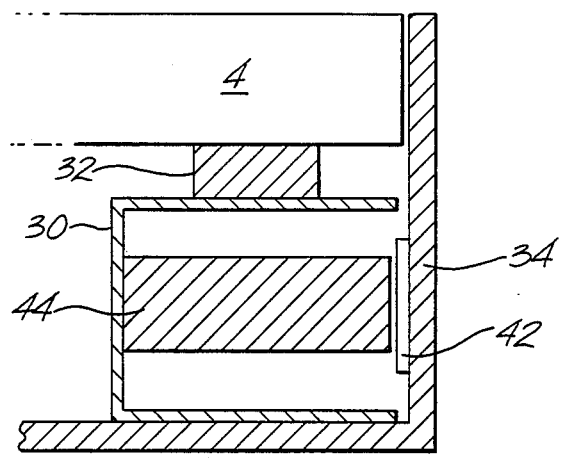
FIG. 3 is a cross-section through the system mounted on one door.

As shown in FIG. 2, a lift or cabin 2 supports a pair of sliding car doors 4 and 6 which can be moved in synchronism towards or away from one another to close or open the opening. An elongate detector strip (8 and 10) is mounted on the outer face of respective car doors 4 and 6 adjacent the leading edges thereof. A pair of opposing landing walls 12 and 16 support respective ones of two sliding landing doors 14 and 18. The landing doors 14 and 18 are synchronised to open and close with the car doors 4 and 6 by control circuitry (not shown).

The detector strips 4 and 6 together define three separate regions in which detection of an obstruction can take place namely, a column like region 20 extending across the leading edges of the car door 4 and the landing door 14, a column like region 22 extending across the leading edges of the car door 6 and the landing door 18, and a planar region 24 extending vertically between the detector strips 8 and 10.

Figure 1:
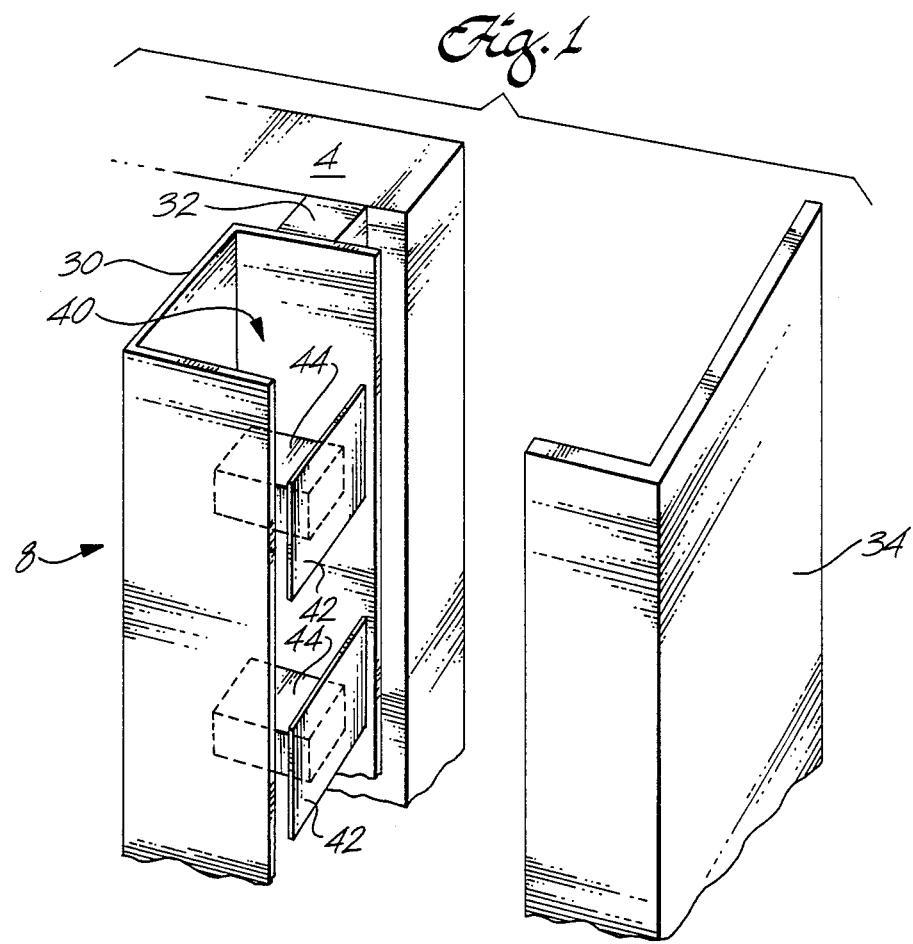
FIG. 1 is a fragmentary perspective view of the proximity detector system with the cover partially removed.

FIG. 1 shows the detector strip 8 mounted on the door 4.

As shown the detector strip 8 comprises a metallic guard 30 of generally U-shaped cross-section supported on the door 4 by an electrically insulating member 32. The guard 30 defines a channel 40 and is mounted on the door 8 with the channel 40 facing the opening defined by the door 8.

An electrically insulating transparent cover 34, generally L-shaped in cross-section, has one leg which bridges the guard 30 and the leading edge of the door 4, and another leg abuts and extends parallel to that face of the guard 30 which lies remote from the door 4.

Mounted within the channel 40 are a row of spaced capacitive plates or antennae 42 (only two shown) and a row of optical transmitter and/or receiver blocks 44 (only two shown).

The capacitive plates 42 are mounted to lie in a plane containing the mouth of the channel 40. Each plate 42 is transparent and may be deposited by any suitable method on the inner face of the leg of the cover 34 which extends across the mouth of the channel. Each optical transmitter and/or receiver block 44 is mounted in the channel directly behind a corresponding plate 42 so that the light path to and from each transmitter/receiver 44 extends through the adjacent plate 42 and the transparent cover 34 into the opening.

The detector strip 10 on the door 6 is similar to the detector strip 8.

In one form of the system, each block 44 of the detector strip 8 comprises a light transmitter for transmitting infra red light across the opening to a corresponding block being a light receiver.

In another form of the system, each block 44 in the strip 8 comprises an infra red light transmitter and an infra red light receiver positioned side by side in a plane extending at right angles to respective doors 4 and 6. The transmitter of each block in the strip 8 is aligned with the receiver of a corresponding block 44 in the opposing strip 10, (the blocks 44 in the strip 10 having no transmitters).

The arrangement is such that each block 44 in the strip 10 can detect the presence of an obstruction in the opening by detecting the interruption of a beam across the opening and, in addition, the receivers of the blocks 44 in the strip 8 can detect the presence of an obstruction in response to an obstruction reflecting a beam from the transmitter back to the receiver of the same block.

It will be appreciated that the use of the transparent capacitive plates or antennae 42, enables the two type of detectors to have intersecting detection zones. This improves the utilisation of space in accommodating the two types of detector in the guard and ensures that no regions are provided through which an obstruction can pass undetected.

Figure 4:
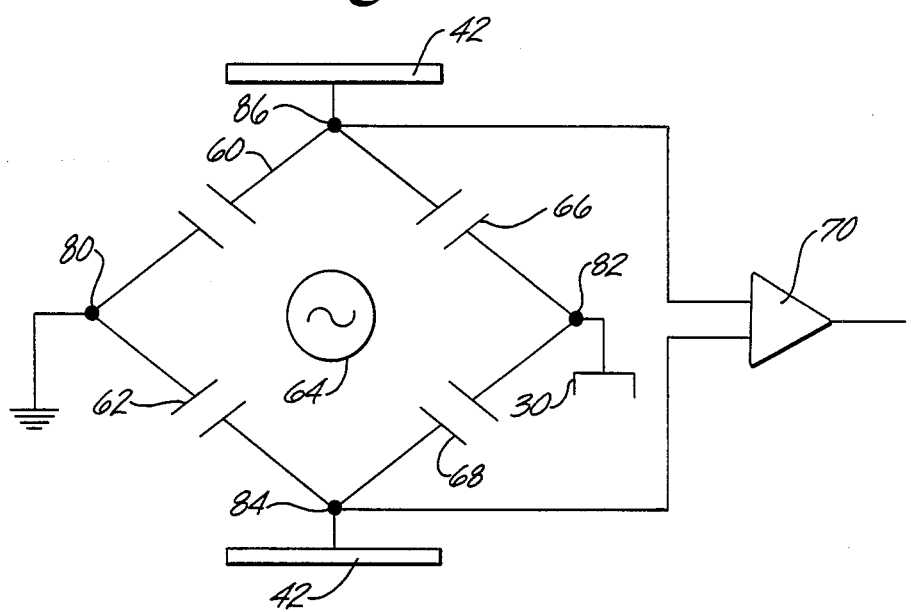
FIG. 4 is a circuit diagram of the capacitive part of the door detector system.

FIG. 4 shows the circuit diagram of the detection system for the capacitive plates or antennae 42.

As shown a bridge circuit comprises four capacitors 60, 62, 66 and 68 connected in respective ones of four arms of the bridge.

The diagonally opposite terminals 80 and 82 of the bridge, representing the junction between capacitors 60 and 62 and the capacitors 66 and 68 are connected to an AC source 64. The other two diagonally opposite terminals 86 and 84 representing the junction between the capacitors 60 and 66 and the junction between the capacitors 62 and 68 are connected to adjacent ones of two capacitor plates or antennae 42 and 42.

The terminals 86 and 84 are also connected to respective inputs of a differential amplifier 70. The terminal 80 is grounded as are the lift doors themselves while the terminal 82 is coupled to the U-shaped guard 30.

The capacitors 60 and 62 represent the capacitive coupling between each plate 42 and the car door 4 which is earthed. The capacitors 66 and 68 represent the capacitive coupling between each plate 42 and the guard 30.

In operation in the absence of any obstruction in the door opening, the capacitance of the capacitors 60 and 62 are of equal value and the capacitance of the capacitors 66 and 68 are also of equal value. As a result the bridge is balanced and the potential difference across the two terminals 86 and 84 is zero.

The presence of an obstruction in the vicinity of plates 42 will unbalance the bridge and this will be reflected by a potential difference appearing across the terminals 84 and 86. This difference is detected by the differential amplifier which produces a signal to the door control circuitry (not shown) to cause the doors to reverse their closing action or if already open, to inhibit their closure.

It will be appreciated that the described proximity detection system can be used in applications other than in lift doors.

I claim:

1. A proximity detection system comprising a detection strip mountable adjacent a leading edge of a door, a capacitive detector mounted within the detection strip which monitors a columnar-like zone extending parallel to the strip and located immediately in front of the leading edge of the door, and an optical detector mounted within the same detection strip which monitors a planar zone intersecting the columnar-like zone and extending across any opening defined between the leading edge of the door and an opposing edge of the opening.

2. A system according to claim 1 including a further detection strip mounted on the opposing edge of the opening, the further detection strip accommodating a capacitive detector for providing a further columnar-like monitoring zone along the opposing edge extending parallel to the columnar-like zone which is immediately in front of the leading edge.

3. A proximity detection system comprising an optical transmitter, positioned adjacent one side of an opening in which detection is to take place, which transmits a light beam across said opening, an optical receiver which receives said light beam under predetermined conditions, a capacitive detector having a capacitive element of translucent electrically conductive material, located adjacent said one side of the opening between the transmitter and the one side of the opening, so that optical transmission to or from the optical transmitter and optical receiver takes place through said capacitive element, and a common housing accommodating said optical transmitter, said optical receiver and said capacitive detector.

4. A system according to claim 3 wherein the transmitter and the receiver are arranged side by side, said receiver being arranged to respond to light from said transmitter reflected by an obstruction in the opening back to the receiver.

5. A system according to claim 3 wherein the receiver is mounted on the opposite side of the opening to the transmitter and is arranged to receive the beam when not interrupted by the presence of an obstruction.

6. A system according to claim 3 wherein the optical transmitter and receiver both operate in the infra red range of light wavelenghts.

7. A system according to claim 3 wherein said common house comprises an elongate channel mounted on said door adjacent the opening for housing the optical transmitter and the capacitive detector.

8. A system according to claim 7 wherein the channel is covered by a translucent electrically insulating cover member and said capacitive element comprises a translucent electrically conductive deposit on the inner face of the cover member.

9. A system according to claim 3 wherein the capacitive element is one of a capacitive plate and antenna.

* * * * *